US011693903B2

(12) United States Patent
Aruga et al.

(10) Patent No.: US 11,693,903 B2
(45) Date of Patent: Jul. 4, 2023

(54) INFORMATION PROCESSING DEVICE, INFORMATION PROCESSING METHOD, AND INFORMATION PROCESSING PROGRAM

(71) Applicant: Nippon Telegraph and Telephone Corporation, Tokyo (JP)

(72) Inventors: Reiko Aruga, Musashino (JP); Tadashi Nunobiki, Musashino (JP)

(73) Assignee: Nippon Telegraph and Telephone Corporation, Tokyo (JP)

( * ) Notice: Subject to any disclaimer, the term of this patent is extended or adjusted under 35 U.S.C. 154(b) by 322 days.

(21) Appl. No.: 17/045,803

(22) PCT Filed: Apr. 3, 2019

(86) PCT No.: PCT/JP2019/014720
§ 371 (c)(1),
(2) Date: Oct. 7, 2020

(87) PCT Pub. No.: WO2019/198577
PCT Pub. Date: Oct. 17, 2019

(65) Prior Publication Data
US 2021/0064664 A1 Mar. 4, 2021

(30) Foreign Application Priority Data
Apr. 10, 2018 (JP) .................. 2018-075392

(51) Int. Cl.
*G06F 16/00* (2019.01)
*G06F 16/9035* (2019.01)
(Continued)

(52) U.S. Cl.
CPC ........ *G06F 16/9035* (2019.01); *G06F 16/901* (2019.01); *G06F 16/9038* (2019.01); *G06F 30/27* (2020.01)

(58) Field of Classification Search
CPC ....................................... G06F 30/27
See application file for complete search history.

(56) References Cited

U.S. PATENT DOCUMENTS

2012/0016678 A1\* 1/2012 Gruber .................. G06N 5/041
704/E21.001

FOREIGN PATENT DOCUMENTS

JP    2009-87073    4/2009
JP    2014-142263   8/2014
(Continued)

*Primary Examiner* — Ajith Jacob
(74) *Attorney, Agent, or Firm* — Fish & Richardson P.C.

(57) ABSTRACT

An information processing device according to embodiments includes a reception unit that receives sensor data related to a user's action, a storage unit that stores a condition indicated by a threshold based on a psychological burden for information that is associated with the user's action and is to be presented to the user and for presentation of the information associated with the action related to the user or a threshold indicated by a psychological burden function, and a determination unit that determines content and a presentation timing of the information that is associated with the action indicated by the sensor data and is to be presented to the user from information stored in the storage unit when the action indicated by the sensor data received by the reception unit satisfies the condition related to the user and stored in the storage unit.

15 Claims, 19 Drawing Sheets

(51) Int. Cl.
 G06F 16/901 (2019.01)
 G06F 16/9038 (2019.01)
 G06F 30/27 (2020.01)

(56) References Cited

FOREIGN PATENT DOCUMENTS

| JP | 2015-22482 | 2/2015 |
| JP | 2016-81091 | 5/2016 |

* cited by examiner

| NOTIFICATION CONTENT ID | NOTIFICATION CONTENT |
|---|---|
| 1 | HOW ARE YOU DOING? |
| 2 | HOW ARE YOU DOING TODAY? |
| 3 | HOW ARE YOU? |
| 4 | ARE YOU OK? |
| 5 | HOW IS IT GOING SO FAR? |
| ... | ... |

Fig. 4

| SOFTENING REMARK ID | TIME SLOT | SOFTENING REMARK |
|---|---|---|
| 1 | 6:00-10:00 | GOOD MORNING |
| 2 | 6:00-10:00 | HELLO |
| 3 | 6:00-10:00 | HI |
| 4 | 10:00-17:00 | HAVE A GOOD EVENING |
| 5 | 10:00-17:00 | HI |
| 6 | 17:00-19:00 | WORK WILL FINISH SOON |
| 7 | 17:00-19:00 | HAVE A GOOD EVENING |
| 8 | 19:00-24:00 | YOU ARE WORKING LATE TODAY |
| 9 | 19:00-24:00 | YOU ARE WORKING HARD TODAY |
| 10 | 19:00-24:00 | HELLO |
| ... | ... | ... |

Fig. 5

| NOTIFICATION ID | TIME SLOT | NOTIFICATION CONTENT |
|---|---|---|
| 1 | 6:00–10:00 | HOW ARE YOU DOING THIS MORNING? |
| 2 | 10:00–12:00 | HOW ARE YOU THIS MORNING? |
| 3 | 10:00–12:00 | HOW IS IT GOING THIS MORNING? |
| 4 | 10:00–12:00 | HOW ARE YOU DOING TODAY? |
| 5 | 12:00–24:00 | HOW ARE YOU THIS MORNING? |
| 6 | 12:00–24:00 | HOW ARE YOU THIS AFTERNOON? |
| 7 | 12:00–24:00 | HOW ARE YOU DOING TODAY? |
| ... | ... | ... |

| ID | TEMPERATURE AT 7 PM | NOTIFICATION CONTENT |
|---|---|---|
| 1 | 0°C OR HIGHER AND LOWER THAN 5°C | IT IS AS COLD AS MIDWINTER TODAY. KEEP YOURSELF WARM. |
| 2 | 5°C OR HIGHER AND LOWER THAN 10°C | IT IS GOING TO BE VERY COLD TODAY. DRESS YOURSELF WARMLY BEFORE YOU GO OUT. |
| 3 | 10°C OR HIGHER AND LOWER THAN 15°C | IT SEEMS RELATIVELY WARM TODAY, BUT KEEP YOURSELF WARM JUST IN CASE. |
| 4 | 15°C OR HIGHER AND LOWER THAN 20°C | IT SEEMS RELATIVELY WARM TODAY. |
| ... | ... | ... |

Fig. 10

| ID | EVENT TRANSITION | Tt | CONTEXT | NOTIFICATION CATEGORY |
|---|---|---|---|---|
| 1 | fridge –> chair –> dustbin | FROM 5 AM TO 10 AM | CLEAN UP AFTER BREAKFAST | GARBAGE COLLECTION INFORMATION |
| 2 | fridge –> chair –> sofa | FROM 5 PM TO 11 PM | RELAX AFTER DINNER | SUGGESTION OF CONTENT |
| 3 | fridge –> chair –> toothbrush | FROM 5 AM TO 10 AM | TEETH BRUSHING AFTER BREAKFAST | MORNING NEWS |
| 4 | fridge –> chair –> toothbrush | FROM 5 PM TO 11 PM | TEETH BRUSHING AFTER DINNER | NIGHT NEWS |
| 5 | fridge –> chair –> makeupset | FROM 5 AM TO 10 AM | MAKEUP AFTER BREAKFAST | REMINDER FOR CREATING SHOPPING LIST |
| ⋮ | ⋮ | ⋮ | ⋮ | ⋮ |

Fig. 13

| DAY OF THE WEEK | NOTIFICATION CONTENT |
|---|---|
| MONDAY | TODAY IS A BURNABLE GARBAGE DAY. |
| TUESDAY | TODAY IS A PLASTIC BOTTLE AND CARDBOARD DAY. |
| WEDNESDAY | − |
| THURSDAY | − |
| FRIDAY | TODAY IS BURNABLE GARBAGE DAY. |
| SATURDAY | TODAY IS A PLASTIC WASTE DAY. |
| SUNDAY | − |

Fig. 14

| ID | CHANCE OF RAIN BETWEEN 7 PM AND 8 PM | NOTIFICATION CONTENT |
|---|---|---|
| 1 | 0% | IT WILL BE FINE ON YOUR WAY HOME. YOU CAN WEAR SHOES FOR A SUNNY DAY. |
| 2 | HIGHER THAN 0% AND LOWER THAN 30% | MAYBE YOU SHOULD TAKE A FOLDING UMBRELLA TODAY JUST IN CASE. |
| 3 | 30% OR HIGHER | PREPARE FOR RAIN WHEN YOU LEAVE HOME TODAY. |

Fig. 16

| ID | EVENT OR EVENT TRANSITION | Tt | CONTEXT | METADATA |
|---|---|---|---|---|
| 1 | fridge | FROM 5 AM TO 10 AM | PREPARATION FOR BREAKFAST | COOKING |
| 2 | chair | FROM 5 AM TO 10 AM | BREAKFAST | MEAL |
| 3 | fridge -> chair -> dustbin | FROM 5 AM TO 10 AM | CLEAN UP AFTER BREAKFAST | CLEAN UP |
| 4 | fridge -> chair -> sofa | FROM 5 PM TO 11 PM | RELAX AFTER DINNER | RELAX |
| 5 | fridge -> chair -> toothbrush | FROM 5 AM TO 10 AM | TEETH BRUSHING AFTER BREAKFAST | GETTING DRESSED |
| 6 | fridge -> chair -> toothbrush | FROM 5 PM TO 11 PM | TEETH BRUSHING AFTER DINNER | GETTING DRESSED |
| 7 | fridge -> chair -> makeupset | FROM 5 AM TO 10 AM | MAKEUP AFTER BREAKFAST | GETTING DRESSED |
| ... | ... | ... | ... | ... |

Fig. 18

| ID | NOTIFICATION CATEGORY | METADATA |
|---|---|---|
| 1 | GARBAGE COLLECTION INFORMATION | CLEAN UP |
| 2 | SUGGESTION OF CONTENT | RELAX |
| 3 | MORNING NEWS | NEWS |
| 4 | NIGHT NEWS | NEWS |
| 5 | REMINDER FOR CREATING SHOPPING LIST | SHOPPING |
| ... | ... | ... |

Fig. 19

INFORMATION PROCESSING DEVICE, INFORMATION PROCESSING METHOD, AND INFORMATION PROCESSING PROGRAM

CROSS-REFERENCE TO RELATED APPLICATIONS

This application is a National Stage application under 35 U.S.C. § 371 of International Application No. PCT/JP2019/014720, having an International Filing Date of Apr. 3, 2019, which claims priority to Japanese Application Serial No. 2018-075392, filed on Apr. 10, 2018. The disclosure of the prior application is considered part of the disclosure of this application, and is incorporated in its entirety into this application.

TECHNICAL FIELD

Embodiments of the present invention relate to an information processing device, an information processing method, and an information processing program.

BACKGROUND ART

In recent years, various research and development have been carried out on systems such as robots and virtual agents that respond to a user when the user asks a question.

Furthermore, in order to save the user the trouble of asking the system for information acquired day to day, a technology for proactively presenting (notifying) information to a user from the system side has been also considered.

Further, there is a system that proactively approaches the user from the system side, triggered by use of an article such as daily supplies (see PTL 1 and 2, for example).

CITATION LIST

Patent Literature

PTL 1: JP 2014-142263 A
PTL 2: JP 2015-022482 A

SUMMARY OF THE INVENTION

Technical Problem

When the system side proactively approaches the user, for example, talks, asks a question, or presents information, the user may be annoyed with the approach from the system depending on the timing, frequency, or content of the proactive approach.

In order to build a system that proactively approaches the user without annoying the user, the system needs to make an approach to the user at good timing, at an appropriate frequency, and with good content for the user.

The present invention has been made focusing on the above circumstances. An object of the present invention is to provide an information processing device, an information processing method, and an information processing program in which content of information to be provided to the user and a timing of presentation of the information can be determined in consideration of the user's psychological burden.

Means for Solving the Problem

In order to achieve the above object, according to a first aspect of the present invention, an information processing device includes a reception unit that receives sensor data related to a user's action, a storage unit that stores a condition indicated by a threshold based on a psychological burden for information that is associated with the user's action and is to be presented to the user and for presentation of the information associated with the action related to the user or a threshold indicated by a psychological burden function, and a determination unit that determines content and a presentation timing of the information that is associated with the action indicated by the sensor data and is to be presented to the user from information stored in the storage unit when the action indicated by the sensor data received by the reception unit satisfies the condition related to the user and stored in the storage unit.

In a second aspect of the information processing device of the present invention, according to the first aspect, the storage unit stores a condition indicated by a threshold of an interval between a timing of an action indicated by a latest data of the sensor data received by the reception unit and a timing of an action indicated by a previous data of the sensor data received by the reception unit, and the determination unit determines the information to be presented to the user and corresponding to the action indicated by the latest data from the information stored in the storage unit when the interval between the timing of the action indicated by the latest data of the sensor data received by the reception unit and the timing of the action indicated by the previous data of the sensor data received by the reception unit satisfies the condition stored in the storage unit.

In a third aspect of the information processing device of the present invention, according to the first aspect, the storage unit stores a condition indicated by a threshold of a time slot to which a timing of the action indicated by the sensor data received by the reception unit belongs and a condition indicated by a threshold of the number of times of acquisition of sensor data indicating an identical action, and the determination unit determines the information that is associated with the action indicated by the sensor data and is to be presented to the user from the information stored in the storage unit when a timing of the action indicated by the sensor data received by the reception unit is within a range of a predetermined time slot, and the number of times of acquisition of the sensor data indicated by the identical action within the range satisfies the condition stored in the storage unit.

A fourth aspect of the information processing device of the present invention, according to the first aspect, further includes a determination unit that determines whether the action indicated by the sensor data received by the reception unit indicates a transition of actions, in which the storage unit stores a condition indicated by a threshold of a time slot to which a timing at which the transition of actions is determined belongs, and the determination unit determines the information that is associated with the action indicated by the sensor data and is to be presented to the user from the information stored in the storage unit when the determination unit determines that the action indicated by the sensor data indicates the transition of actions and the timing at which the transition of actions is determined is within a range of the time slot indicated by the threshold stored in the storage unit.

Ina fifth aspect of the information processing device of the present invention, according to the third aspect, the determination unit determines the information that is associated with the action indicated by the sensor data and is to be presented to the user from the information stored in the storage unit after a predetermined period of time based on a psychological burden elapses when a timing of the action indicated by the sensor data received by the reception unit is within the range of the predetermined time slot and the number of times of acquisition of the sensor data indicated by the identical action within the range satisfies the condition stored in the storage unit.

A sixth aspect of the information processing device of the present invention, according to the first aspect, further includes a presentation unit that presents the information determined by the determination unit to the user, an input unit that accepts an input of feedback from the user about presentation of the information by the presentation unit, and an update unit that updates the threshold stored in the storage unit in accordance with the feedback input by the input unit.

One aspect of an information processing method performed by the information processing device according to one embodiment of the present invention receives sensor data related to a user's action, and determines content and a presentation timing of information that is associated with the action indicated by the sensor data and is to be presented to the user from a storage device that stores information that is in accordance with the user's action and is to be presented to the user when the action indicated by the received sensor data satisfies a condition indicated by a threshold based on a psychological burden for presentation of the information associated with the action related to the user or a threshold indicated by a psychological burden function.

One aspect of the information processing program according to one embodiment of the present invention causes a processor to function as each unit of the information processing device described in any one of the first to sixth aspects.

Effects of the Invention

According to the first aspect of the information processing device in one embodiment of the present invention, the content and the presentation timing of information to be provided to the user can be determined in consideration of the condition based on the user's psychological burden.

According to the second aspect of the information processing device in one embodiment of the present invention, the information to be provided to the user can be determined in consideration of the interval between the timing of the action indicated by the sensor data and the timing of the action indicated by the previous data of the sensor data received by the reception unit.

According to the third aspect of the information processing device in one embodiment of the present invention, the information to be presented to the user can be determined in consideration of the timing of the action indicated by the sensor data and the number of times of acquisition of the sensor data indicating the identical action in the predetermined time slot.

According to the fourth aspect of the information processing device in one embodiment of the present invention, the information to be presented to the user can be determined in consideration of the timing of the action indicated by the sensor data and the time slot based on the psychological burden.

According to the fifth aspect of an information processing device in one embodiment of the present invention, the information to be presented to the user can be determined in consideration of the timing of the action indicated by the sensor data, the number of times of acquisition of the sensor data indicating the identical action in the predetermined time slot, and the elapsed time.

According to the sixth aspect of the information processing device in one embodiment of the present invention, the threshold can be updated in accordance with input of the feedback to the information provided to the user can be updated.

That is, according to the present invention, the content and the timing of presentation of the information to be provided to the user can be determined in consideration of the user's psychological burden.

BRIEF DESCRIPTION OF DRAWINGS

FIG. 4 is a diagram illustrating, in a tabular format, an example of the notification content stored in the data storage unit of the electronic terminal of the information presentation system according to the first embodiment of the present invention.

FIG. 5 is a diagram illustrating, in a tabular format, an example of the notification content stored in the data storage unit of the electronic terminal of the information presentation system according to the first embodiment of the present invention.

FIG. 10 is a diagram illustrating, in a tabular form, an example of the notification content stored in a data storage unit of an electronic terminal according to the second embodiment of the present invention.

FIG. 13 is a diagram illustrating, in a tabular format, relationships of event transitions, time slots, contexts, and notification categories stored in a data storage unit of an electronic terminal of the information presentation system according to the third embodiment of the present invention.

FIG. 14 is a diagram illustrating, in a tabular format, an example of the notification content stored in the data storage unit of the electronic terminal of the information presentation system according to the third embodiment of the present invention.

FIG. 16 is a diagram illustrating, in a tabular format, an example of the notification content stored in a data storage unit of an electronic terminal of the information presentation system according to the fourth embodiment of the present invention.

FIG. 18 is a diagram illustrating an example of a semantic space model used by the information presentation system according to the fifth embodiment of the present invention.

FIG. 19 is a diagram illustrating an example of the semantic space model used by the information presentation system according to the fifth embodiment of the present invention.

DESCRIPTION OF EMBODIMENTS

Hereinafter, one embodiment of the present invention will be described below with reference to the drawings.

An information presentation system according to this embodiment predefines a parameter relating to a psychological burden for information presentation, for example, a threshold such as a frequency, timing, and content. Then, whether information can be presented is determined by a psychological burden function based on the predefined threshold upon detecting a specific pattern of use of an article (event) or use of a location.

When the information presentation system determines that the psychological burden is low, the information presentation system, triggered by this determination, allows information presentation by an appropriate number of times at an appropriate timing by presenting the information to a user.

At this time, the determination of the psychological burden may be a determination using the above psychological burden function based on the threshold. Alternatively, a model related to the psychological burden may be separately provided and the determination may be based on this model.

Further, an interface that allows a user to give a feedback on the information presentation is provided, and thus definition information can be updated.

Furthermore, the information presentation system uses feedback from multiple users as collective intelligence to allow a user to select a preset in accordance with a living condition, and to allow the system to recommend a preset.

These means allow for proactive information presentation that is more suitable to the user's situation and imposes a low psychological burden.

First Embodiment

In a first embodiment, one embodiment of the present invention is shown that optimizes the frequency of notifications by providing a threshold for an interval of the notifications to reduce the annoyance the user feels for the notifications.

Figure 1:
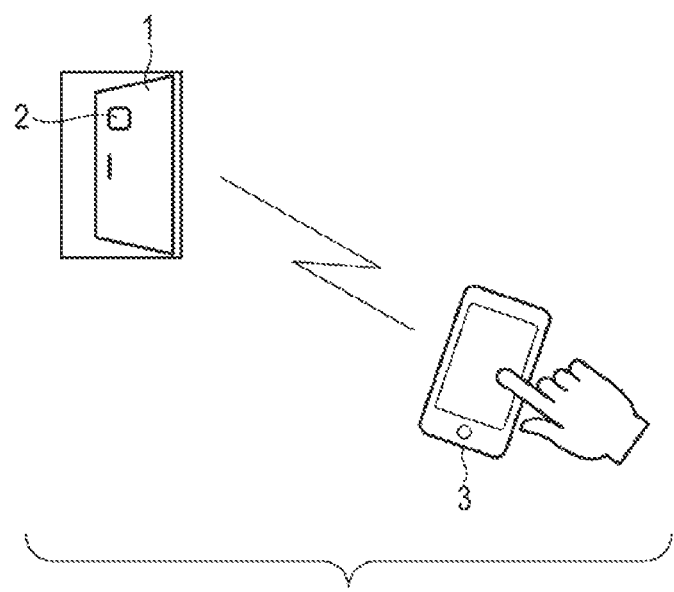
FIG. 1 is a diagram illustrating an example of an overall configuration of an information presentation system according to a first embodiment of the present invention.

FIG. 1 is a diagram illustrating an example of an overall configuration of an information presentation system according to the first embodiment of the present invention.

As shown in FIG. 1, the information presentation system according to the first embodiment includes a sensor node 2 and an electronic terminal (information processing device) 3 that receives sensor data from the sensor node 2.

The sensor node 2 is a device equipped with various sensors that detect an action by a user, for example, use of an article 1 by the user, or use of a location by the user (hereinafter referred to as event). A specific example of the sensor node 2 is, for example, an acceleration sensor, an illuminance sensor, a temperature sensor, a humidity sensor, or a carbon dioxide sensor.

The electronic terminal 3 is a device that receives data from the sensor node 2, and for example, a smartphone, a tablet terminal, a wearable terminal, a robot, a microcomputer, or a microcomputer built-in smart speaker can be used. The electronic terminal 3 can be configured as a computer that includes a central processing unit (CPU), a program memory, a calculation memory, and the like. The sensor node 2 may also be configured to include a computer.

Figure 2:
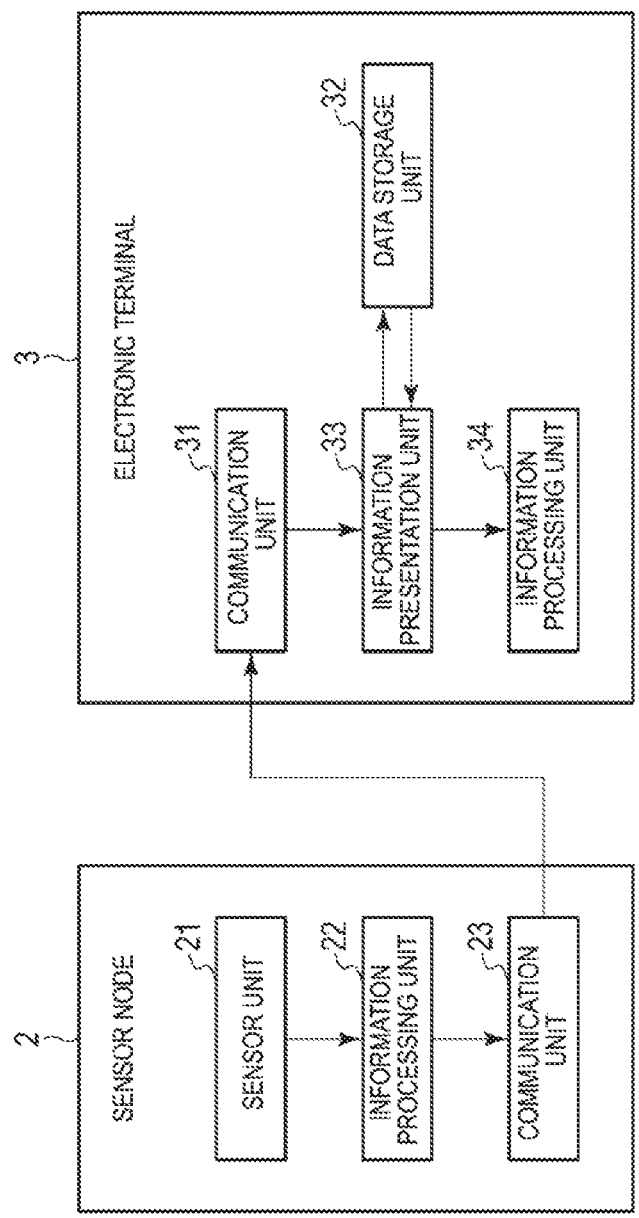
FIG. 2 is a block diagram illustrating an example of a configuration of the information presentation system according to the first embodiment of the present invention.

FIG. 2 is a block diagram illustrating an example of a configuration of the information presentation system according to the first embodiment of the present invention.

As shown in FIG. 2, in the first embodiment, the sensor node 2 is attached or installed on the article 1. The article 1 may be various daily goods that involves movement, such as a door of an office, a door at a home entrance or the like, a refrigerator door, a washing machine lid, a lid of a trash can, a chair, a sofa, a bed, a window, a curtain, a medicine box, a collar for a pet, a bag, or an umbrella, or may be various fittings that do not involve movement, such as a shelf, a wall, a floor, a column, or a ceiling.

The sensor node 2 includes a sensor unit 21, an information processing unit 22, and a communication unit 23.

The sensor unit 21 is equipped with at least one type of sensor of various types of sensors, such as an acceleration sensor, an illuminance sensor, a temperature sensor, a humidity sensor, an ultraviolet sensor, or a carbon dioxide sensor. The sensor unit 21 measures sensor data required to detect an event.

The information processing unit 22 performs a calculation of a threshold determination or the like on the sensor data acquired by the sensor unit 21. The communication unit 23 transmits a processing result of the information processing unit 22 or raw data acquired by the sensor unit 21 to the electronic terminal 3. At this time, a communication scheme between the sensor node 2 and the electronic terminal 3 is a radio communication scheme such as Bluetooth (registered trademark).

The electronic terminal 3 includes a communication unit 31, a data storage unit (information storage device) 32, an information processing unit 33, and an information presentation unit 34. Components in the electronic terminal 3 can be embodied by causing the CPU to execute a program stored in the program memory.

The communication unit 31 receives data transmitted from the communication unit 23 of the sensor node 2.

The data storage unit 32 stores a predefined threshold Ti representing an optimal notification interval, notification content, and the like as a condition for reducing the psychological burden on the user for presentation of information associated with an action. This data storage unit 32 is embodied, for example, by a non-volatile memory.

The information processing unit 33 processes data received from the sensor node 2 and detects an event. The event is, for example, use of an article or use of a location. For example, when the article 1 is a door and the sensor unit 21 is an acceleration sensor, the information processing unit 33 performs a threshold determination on a value of the acceleration sensor to detect use of the door.

Further, for example, when the article 1 is an upper part of a shelf and the sensor unit 21 is an illuminance sensor, the information processing unit 33 performs a threshold determination on a value of the illuminance sensor to detect that the illumination provided in a living room, a bedroom or the like in which the sensor node 2 is installed is turned on, and detect use of a location such as the living room or the bedroom by the user. Subsequently, the information processing unit 33 refers to the data storage unit 32 to determine notification content associated with the action of the user.

The information presentation unit 34 presents notification content determined by the information processing unit 33 to the user. At this time, a type of information presentation by the information presentation unit 34 may be an audio output from a speaker or may be a screen display on a display.

In the first embodiment, assuming a situation where a worker's mental health in an office is measured, the article 1 is an office door, the sensor unit 21 of the sensor node 2 is an acceleration sensor, and the electronic terminal 3 is a smartphone.

In the first embodiment, when a worker carrying the electronic terminal 3 capable of communicating by Bluetooth with the sensor node 2 in the office passes through the door to which the sensor node 2 is attached, the electronic terminal 3 that has detected an event that the door is opened and closed outputs a question such as "How are you?" by voice. Simultaneously, a similar question is displayed on a screen, and the worker responds to the question using a graphical user interface (GUI). This system will be described below.

In this system, for example, when the worker goes out of the office from inside through the door and goes to a bathroom, and then comes back to the office through the door again, the question about mental health is notified to the worker after a short period of time (here, in a few minutes) after the worker goes out of the office. However, it is unlikely that the worker's condition changes in these few minutes, and the worker may be annoyed with this notification.

In order to reduce the user's annoyance at the notification frequency, in the first embodiment, the threshold Ti of the interval of the notification frequency is set. When use of an article or use of a location is detected, elapsed time dt from the previous notification is calculated. When this elapsed time dt is less than the interval threshold Ti, a notification is not issued. On the other hand, when the elapsed time dt is equal to or greater than the interval threshold Ti, content of a notification to the user is determined, and a notification of this determined content is issued.

That is, in the first embodiment, content of a notification to the user is determined when an interval between a timing of action indicated by the latest data of the received sensor data and a timing of the action indicated by the previous data of the received sensor data is an interval based on the psychological burden.

Here, a degree of annoyance of the user relative to the notification frequency is considered to vary depending on the notification content. For example, in a system, assuming a situation where a student memorizes words in a foreign language at home, and a word that the student is attempting to memorize is notified in an audio output when the student opens the door of his or her room, a setting of intervals is considered to not be necessary because there is no problem if the word is notified to the student every time the door is opened or closed. That is, Ti=0 can be considered.

Figure 3:
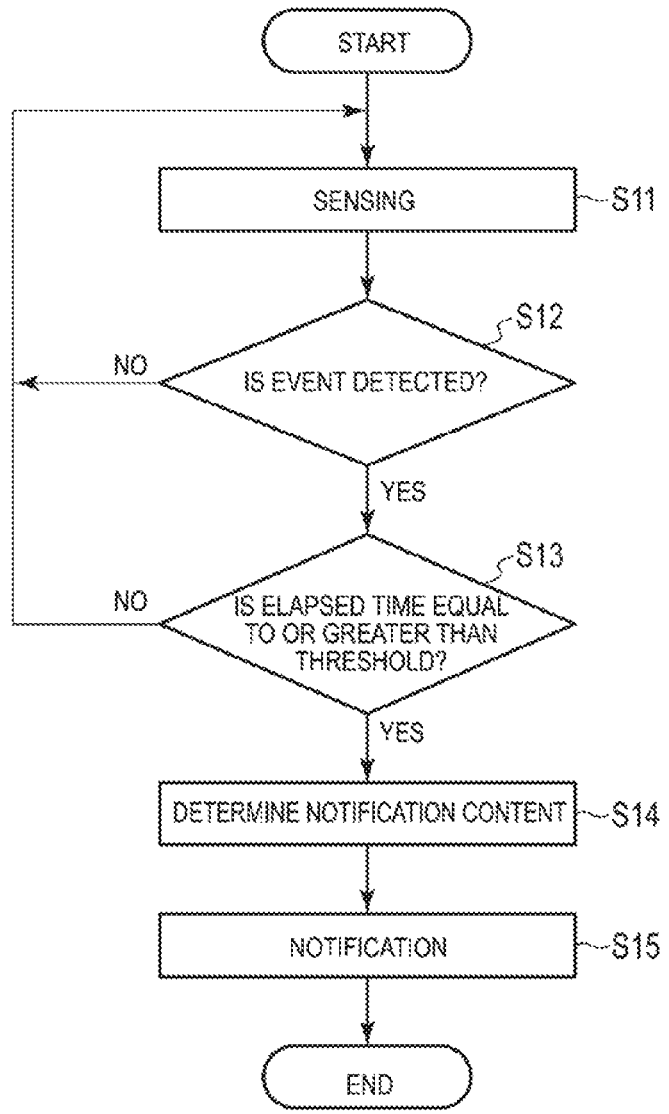
FIG. 3 is a diagram illustrating, in a tabular format, an example of notification content stored in a data storage unit of an electronic terminal of the information presentation system according to the first embodiment of the present invention.

FIG. 3 is a flowchart illustrating an example of operations of the information presentation system according to the first embodiment of the present invention.

In the first embodiment, the sensor node 2 attached to the door as the article 1 and equipped with the acceleration sensor is constantly measuring acceleration (S11). In a case where there is no change in the measured acceleration, the sensor node 2 is constantly broadcasting a false signal by Bluetooth. In a case where there is a change in the acceleration, the sensor node 2 is constantly broadcasting a true signal by Bluetooth.

At this time, in order to reduce power consumption, the sensor node 2 may be set so as to communicate with the electronic terminal 3 only when the acceleration changes.

When the user passes through the door to which the sensor node 2 is attached, carrying the electronic terminal 3, the electronic terminal 3 receives a true signal from the sensor node 2, and the information processing unit 33 in the electronic terminal 3 detects an event of use of the door by the user (S12).

The information processing unit 33 calculates the elapsed time dt from the time when the previous notification was issued, and determines whether the elapsed time dt is equal to or greater than the interval threshold Ti stored in the data storage unit 32 (S13).

When the elapsed time dt is equal to or greater than the interval threshold Ti (Yes in S13), the information processing unit 33 refers to the data storage unit 32 to determine the notification content associated with the user's action (S14) and performs notification of the determined notification content by the information presentation unit 34 (S15).

Here, a response to the notification content may be entered by the user in a natural sentence by the GUI of the electronic terminal 3. Alternatively, the user may select from options such as "very good", "good", "OK", "not good", and "terrible" by the GUI.

The electronic terminal 3 may include a voice recognition function, and a response to the notification content may be input by the user by voice recognition.

Figures 6, 7:
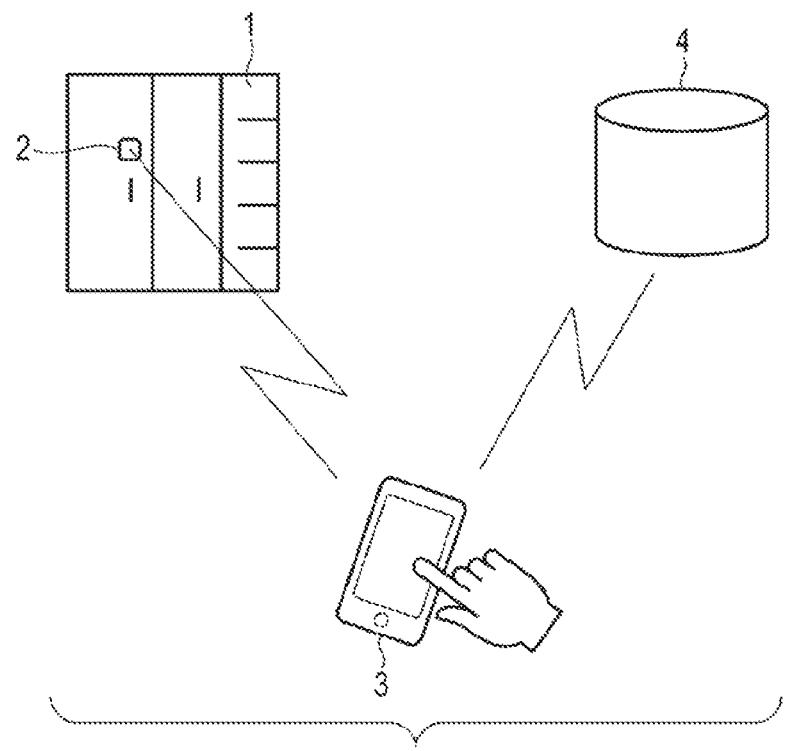
FIG. 6 is a diagram illustrating, in a tabular form, an example of the notification content stored in the data storage unit of the electronic terminal of the information presentation system according to the first embodiment of the present invention.
FIG. 7 is a diagram illustrating an example of an overall configuration of an information presentation system according to a second embodiment of the present invention.

FIG. 4, FIG. 5, and FIG. 6 are diagrams each illustrating, in a tabular form, an example of the notification content stored in the data storage unit 32 of the electronic terminal 3 of the information presentation system according to the first embodiment of the present invention. The question about the mental health as the notification content may be always the same wording. Alternatively, as shown in FIG. 4, the data storage unit 32 may prepare a plurality of types of questions about the mental health in association with a notification content ID, and the information processing unit 33 may randomly select the notification content to be determined upon determining the notification content.

Further, when the system proactively approaches the user, changing the wording of the notification in accordance with the time slot may be preferred since the user perceives that the system understands the context. Thus, as in FIG. 5, a softening remark suitable to the time slot as an introductory remark of a question may be stored in the data storage unit 32 in association with the softening remark ID, and the information processing unit 33 may select a softening remark, in accordance with the current time slot, as the softening remark to be notified to the user. Further, as shown in FIG. 6, the data storage unit 32 stores notification content suitable to the time slots, and the information processing unit 33 may select a question in accordance with the time slot to which the current time belongs.

Here, it is unnatural if the softening remark corresponding to a greeting such as "Good morning" is notified many times a day. Thus, as a method of selecting a softening remark suitable to a time slot, a softening remark corresponding to a greeting may be forcibly selected only when the detected event appears for the first time in a relevant time slot such that the information processing unit 33 does not select the same greeting for the same event.

In the first embodiment, an example has been illustrated in which the events of opening and closing of the office door and the notification content related to the mental health check are associated with each other. However, other events and notification content can be combined in various ways.

Second Embodiment

In a second embodiment, one embodiment of the present invention is shown that optimizes a notification timing by providing a threshold for the time slot of the notification and a threshold for the number of occurrences of events, thereby reducing the users annoyance at the notification.

FIG. 7 is a diagram illustrating an example of an overall configuration of an information presentation system according to the second embodiment of the present invention.

Figure 8:
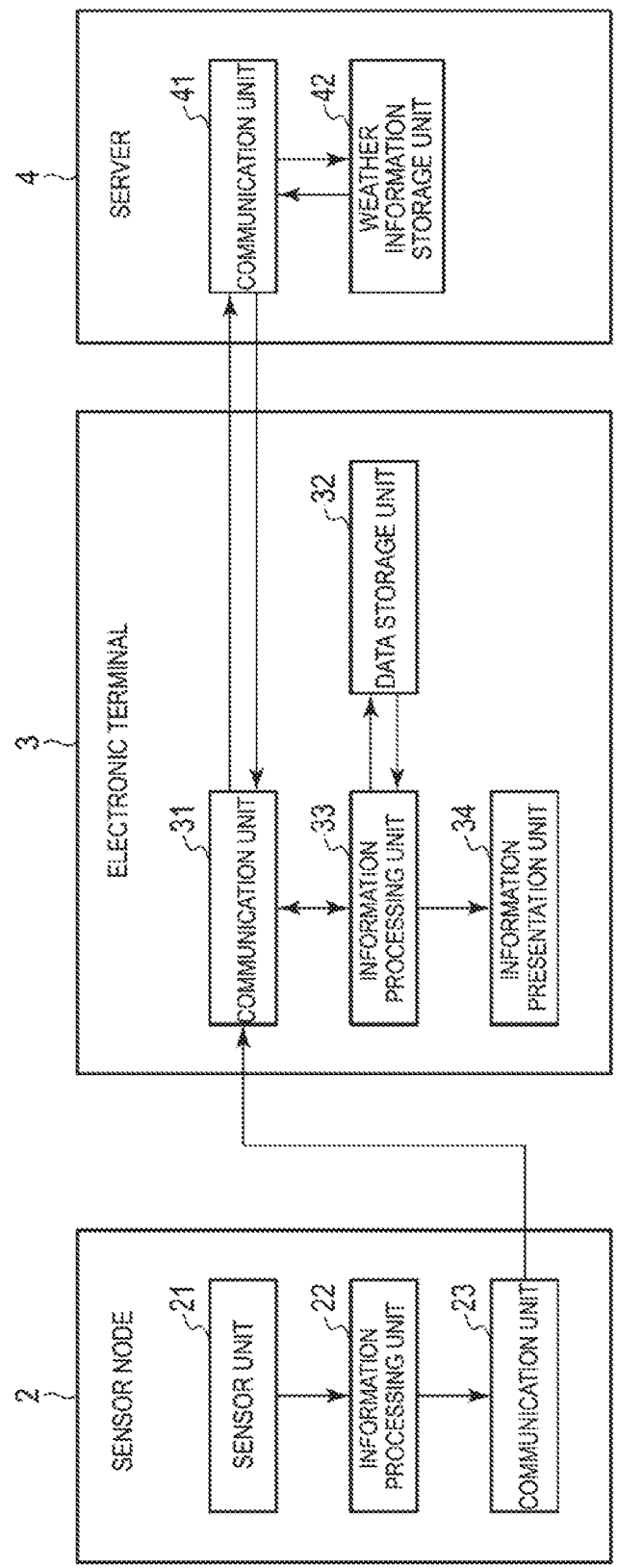
FIG. 8 is a block diagram illustrating an example of a configuration of the information presentation system according to the second embodiment of the present invention.

FIG. 8 is a block diagram illustrating an example of a configuration of the information presentation system according to the second embodiment of the present invention.

As shown in FIG. 8, the information presentation system according to the second embodiment includes the article 1, the sensor node 2, the electronic terminal 3, and a server 4. The article 1, the sensor node 2, and the electronic terminal 3 have a configuration similar to the configuration in the first embodiment.

The server 4 can be configured as a computer including a CPU, a program memory, a calculation memory, and the like, and has a communication unit 41 and a weather information storage unit 42. Components in the server 4 can be implemented by causing the CPU to execute a program stored in the program memory. The communication unit 41 exchanges weather information with the communication unit 31 of the electronic terminal 3. The weather information storage unit 42 is embodied by a non-volatile memory or the like, and stores the weather information.

In the second embodiment, assuming a situation where the system notifies the user of recommendation of clothes suitable to the climate of the day when the user changes clothes at home in the morning, the article 1 is furniture that the user opens and closes upon changing clothes (e.g., closet or storage at home), the sensor unit 21 of the sensor node 2 is an acceleration sensor, and the electronic terminal 3 is a smartphone.

In the second embodiment, a system is assumed in which when the user opens or closes the closet to which the sensor node 2 is attached, the electronic terminal 3 that has detected an event of opening or closing of the closet outputs a notification such as "It is going to be very cold today. Dress yourself warmly before you go out." by voice, and similar notifications are displayed on the screen at the same time.

In this system, the closet or the like is opened and closed in time slots other than a time slot for a change of clothes in the morning, such as when the user puts washed clothes into the closet or the like and when the user changes into loungewear after coming home at night.

Here, it is inconsistent with the context of the user's action that the recommendation of clothes is notified every time the closet or the like is opened or closed, and such a notification may annoy the user.

Even if the time slot of notification is controlled to be limited to only a certain time slot, such as from 5 AM to 10 AM, an event that a closet or the like is opened or closed still possibly occurs multiple times in the certain time lot, and also, the user may be still annoyed by being notified of recommendation of clothes many times.

In the second embodiment, as conditions for reducing the user's psychological burden for the presentation of information associated with the action, a threshold Tt for performing control in accordance with the time slot and a threshold Tc for performing control in accordance with the number of times the events have occurred are set and stored in the data storage unit 32 in order to reduce the user's annoyance at the timing of the notification as described above.

In the second embodiment, content of a notification to the user is determined only when the current time is within a range of the threshold Tt of the time slot and a number of occurrences n of the event in the time slot of the day is equal to the threshold Tc upon detection of the event.

In the second embodiment, Tc=1 assuming that in a case where the current time is within a range of the threshold Tt of the time slot, a notification is issued only when the event of opening or closing of the closet appears for the first time.

That is, in the second embodiment, the content of the notification to the user is determined when the timing of the action indicated by the sensor data is a timing within a range of a predetermined time slot and the number of times of acquisition of the sensor data indicating the same action within this range is the number of times based on the user's psychological burden.

Figure 9:
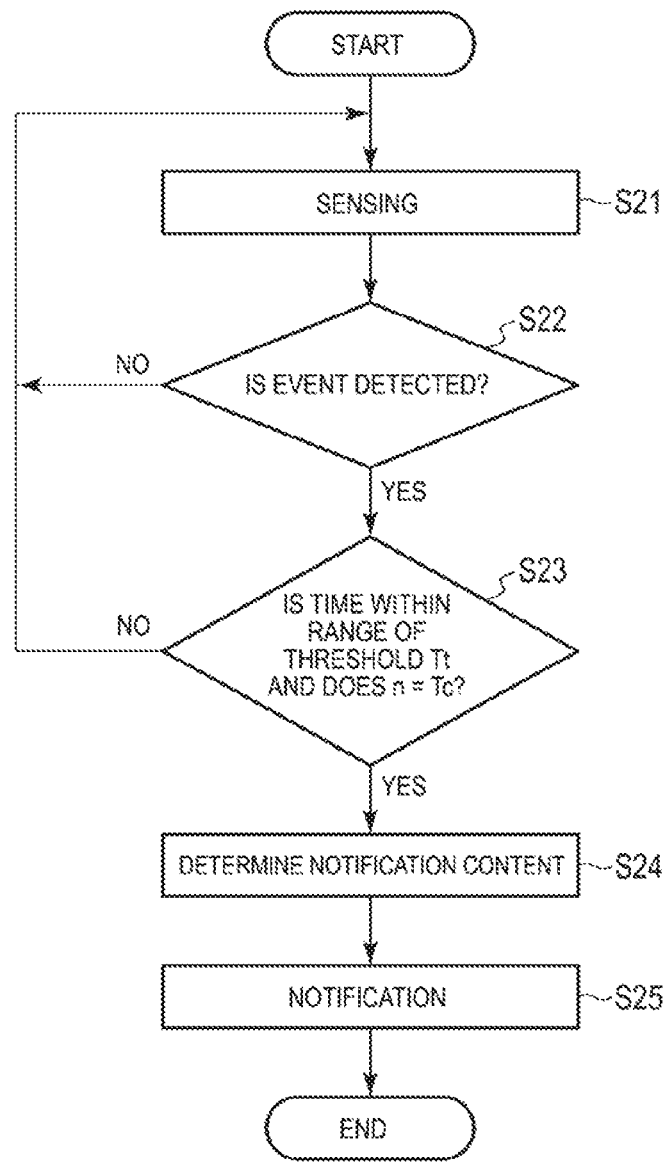
FIG. 9 is a flowchart illustrating an example of operations of the information presentation system according to the second embodiment of the present invention.

FIG. 9 is a flowchart illustrating an example of operations of the information presentation system according to the second embodiment of the present invention.

In the second embodiment, the sensor node 2 attached to the closet as the article 1 and equipped with the acceleration sensor constantly measures acceleration (S21). In a case where there is no change in the measured acceleration, the sensor node 2 is constantly broadcasting a false signal by Bluetooth. In a case where there is a change in the acceleration, the sensor node 2 is constantly broadcasting a true signal by Bluetooth.

At this time, in order to reduce power consumption, the sensor node 2 may be set so as to communicate with the electronic terminal 3 only when the acceleration changes.

When the closet to which the sensor node 2 is attached is opened or closed by the user, the electronic terminal 3 receives a true signal from the sensor node 2, and the information processing unit 33 in the electronic terminal 3 detects the event of use of the closet by the user (S22).

The information processing unit 33 determines whether the time of this detection is time within the range of the threshold Tt stored in the data storage unit 32, and whether the number of occurrences n of the event within the range of the threshold Tt of the time slot is equal to Tc stored in the data storage unit 32 (S23).

When the time of the detection is within the range of the threshold Tt of the time slot, and n=Tc (Yes in S23), the information processing unit 33 acquires information about a predicted temperature in a predetermined time slot or the like from the weather information storage unit 42 of the server 4.

Then, with reference to the acquired information and the information stored in the data storage unit 32, the information processing unit 33 determines the notification content corresponding to the predicted temperature and associated with the user's action (S24), and notifies the user of the determined notification content via the information presentation unit 34 (S25).

For example, when the threshold Tt in the time slot is set from 5 AM to 10 AM, and the user opens or closes the closet at 7 AM, the user is notified of recommendation of clothes corresponding to the predicted temperature, but the user is not notified when the closet is opened or closed again after a few minutes. Here, the predicted temperature may be a predicted temperature to be experienced in consideration of wind strength, wind direction, weather, and the like.

FIG. 10 is a diagram illustrating, in a tabular form, an example of the notification content stored in the data storage unit 32 of the electronic terminal 3 according to the second embodiment of the present invention.

As shown in FIG. 10, notification content corresponding to the predicted temperature between 7 PM to 8 PM is stored in the data storage unit 32 according to the second embodiment. In FIG. 10, a time slot in which the user comes home in the cold season is assumed, and notification content related to the recommendation of the user's clothes is shown. However, the notification content may be notification content suitable to the season, such as notification content defined by assuming a daytime time slot of a hot season.

Further, a wording that represents an intensity of cold or warmth included in the notification content may be a wording such as "It will be much colder than yesterday.", or "It is warmer than this time in an average year.". This wording can be acquired by the information processing unit 33 referring to information about the temperature of the previous day and the temperature of the average year from the weather information storage unit 42 of the server 4.

Furthermore, the relationship between the temperature and the clothes is related to the time slot in which the user is outside. Thus, based on the user's setting of his or her lifestyle on the system, the content of the recommendation of clothes may vary, for example, between an employee who works in an office and is exposed to outside air only in the morning and at night and an employee who works outside of an office in the daytime, and between an employee who comes home at night and a part-time employee who comes home in the evening.

At this time, for example, in a case where an employee who comes home at night (A) and a part-time employee who comes home in the evening (B) live at the same place together, the recommendation of clothes based on the above predicted temperature at night may be notified to the electronic terminal 3 owned by A when different sensor nodes 2 are attached respectively to a closet used by A and a closet used by B, and then the closet used by A is opened or closed.

On the other hand, the recommendation of clothes based on the above predicted temperature at the evening may be notified to the electronic terminal 3 owned by B that is a terminal different from the electronic terminal 3 owned by A when the closet used by B is opened or closed. As described above, information may be presented in a manner suitable to each person.

In this way, attaching different sensor nodes to different users' own belongings may cause information presentation suitable to each person. Alternatively, information may be presented in a manner suitable to each person using a predetermined radio wave intensity. For example, in a case where a closet is shared by A and B described above, when the communication scheme between the sensor node 2 attached to the closet and the electronic terminal 3 owned by A or B is Bluetooth, the radio wave intensity can be set such that the sensor node 2 and the electronic terminal 3 can communicate with each other only by a short distance of a few meters.

Here, assuming that each person carries the electronic terminal 3 at home, the use of the closet can be detected by only the electronic terminal 3 of the user using the closet to change clothes. Presentation of information suitable to each person may be achieved by only the electronic terminal 3 that is held by the person who has used the closet detecting an event of use of the closet.

Note that it is also possible to define thresholds Tt of the multiple time slots in one day. For example, when the closet is opened or closed from 5 AM to 10 AM, the recommendation of clothes for going outside are notified. When the closet is opened or closed from 6 PM to 12 AM, the recommendation of loungewear, such as "It'll be cold tonight. Keep yourself warm when you sleep." or "It'll be sleepless sweltering night tonight. Try and keep yourself cool." can be notified.

In the second embodiment, an example has been illustrated in which the event that the closet is opened or closed and the notification content of the recommendation of clothes are associated with each other. However, other events and notification content can be combined in various ways.

For example, when the article 1 is a chair of a child's study desk and an event that the chair is used (the chair is touched) is detected after 3 PM, an example is conceivable in which, for example, a recommendation of autonomous learning content is presented to a user (the child). This allows no notification to be issued when the chair is used in a different context from the child's studying, such as while the child is preparing for going to school in the morning or while the mother is cleaning the child's room in the daytime.

Further, for example, when the article 1 is a lid of a washing machine and an event that the washing machine is used is detected from 5 AM to 10 AM, information on a chance of rain in the daytime can be presented to the user. At this time, since a time slot in which the washing machine is operated is considered to depend on a family, the threshold Tt of the time slot may be changed by the user on the GUI of the electronic terminal 3.

Further, the user may be notified of a suitable day for laundry, for example, when the chance of rain of the day is low, the user may be notified of a message "It seems OK to do the laundry today.", and when the chance of rain of the day is high and the chance of rain of the next day is low, the user may be notified of a message "It seems better to do the laundry tomorrow". Alternatively, when the chance of rain of the day is low, the user may be notified of a message "It is OK to hang the laundry to dry outside today". When the chance of rain of the day is high, the user may be notified of a suitable location for hanging the laundry to dry with a message "It is better to dry the laundry in the bathroom".

These notification categories may be selected by the user by the GUI of the electronic terminal 3. In addition, a family using remaining water in the bathtub for laundry may desire to know information about laundry during bath time. In such a scene, the sensor node 2 may be attached to a bathroom door, and information related to the opening and closing of the bathroom door and information about laundry may be linked to a notification message and stored in the data storage unit 32.

Third Embodiment

In a third embodiment, one embodiment of the present invention is shown that optimizes notification content by providing a threshold relating to the time slot of the notification and a rule relating to a transition of multiple events and considers the context, thereby reducing the user's annoyance at the notification.

Figure 11:
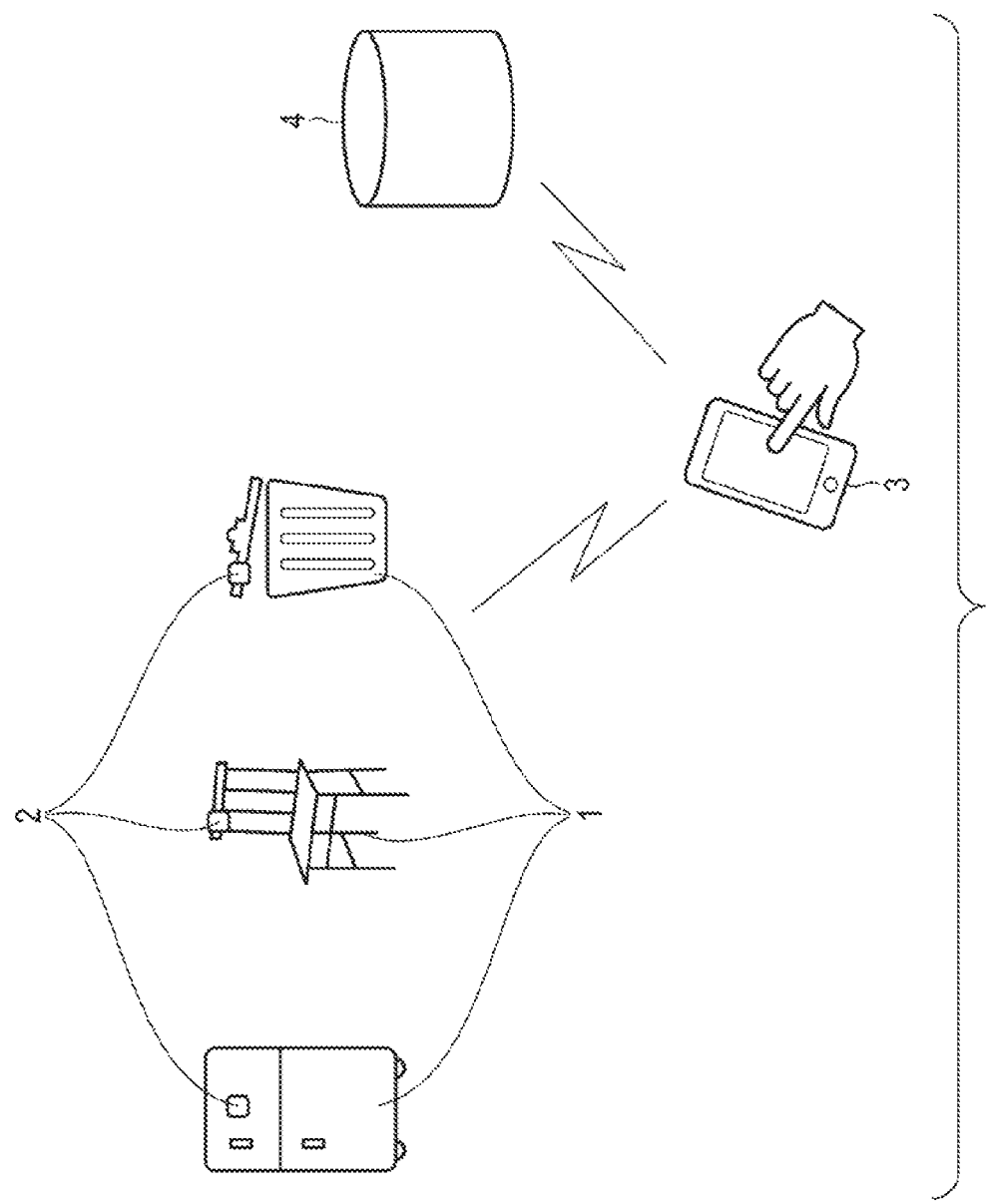
FIG. 11 is a diagram illustrating an example of an overall configuration of an information presentation system according to a third embodiment of the present invention.

FIG. 1 is a diagram illustrating an example of an overall configuration of an information presentation system according to the third embodiment of the present invention. As shown in FIG. 11, the information presentation system according to the third embodiment includes the article 1, the sensor node 2, the electronic terminal 3, and the server 4, similarly to the second embodiment. However, it is assumed that a storage device of the server 4 stores information on collection dates of various types of garbage.

In the third embodiment, a system is considered that notifies the user of recommendation of taking out garbage when the user is cleaning up after breakfast and the day is a garbage collection day.

In this system, for example, when the sensor node 2 is attached to a lid of a trash can to detect use of the trash can by the user, as in the second embodiment, a threshold of the time slot and a threshold of the number of occurrences of events are set as conditions to reduce the user's psychological burden for the presentation of information associated with the action. The notifications can be thus issued at optimum timings.

However, even when a notification of garbage collection is issued during preparation for breakfast, the user may forget to collect garbage after the meal.

It is thus considered that the notifications relating to garbage collection are more suitable after meal than during preparation of a meal. In the third embodiment, the threshold of the time slot and the rule of the transition of multiple events are set as conditions for reducing the user's psychological burden for the presentation of information associated with the action, a context of after meal is detected, and thus the content of the notification can be optimized.

In the third embodiment, the information presentation system determines information to be presented to the user when the timing of the action indicated by the sensor data is a timing within a range of a time slot based on the psychological burden.

In the third embodiment, in order to detect a context of "cleaning up after breakfast", it is assumed that the article 1 is a refrigerator door, a dining chair used at a meal, and a lid of a trash can, a sensor unit 21 of the sensor node 2 is an acceleration sensor, and the electronic terminal 3 is a smartphone.

In the third embodiment, "clean up after breakfast" is defined as to undergo a transition that after the user uses a refrigerator, the user uses the dining chair, and then the user uses the trash can. In the third embodiment, the threshold Tt of the time slot is stored in the data storage unit 32, and the information presentation system issues a notification about garbage collection when the trash can is used by the user through the transition within the range of this threshold Tt of the time slot.

Figure 12:
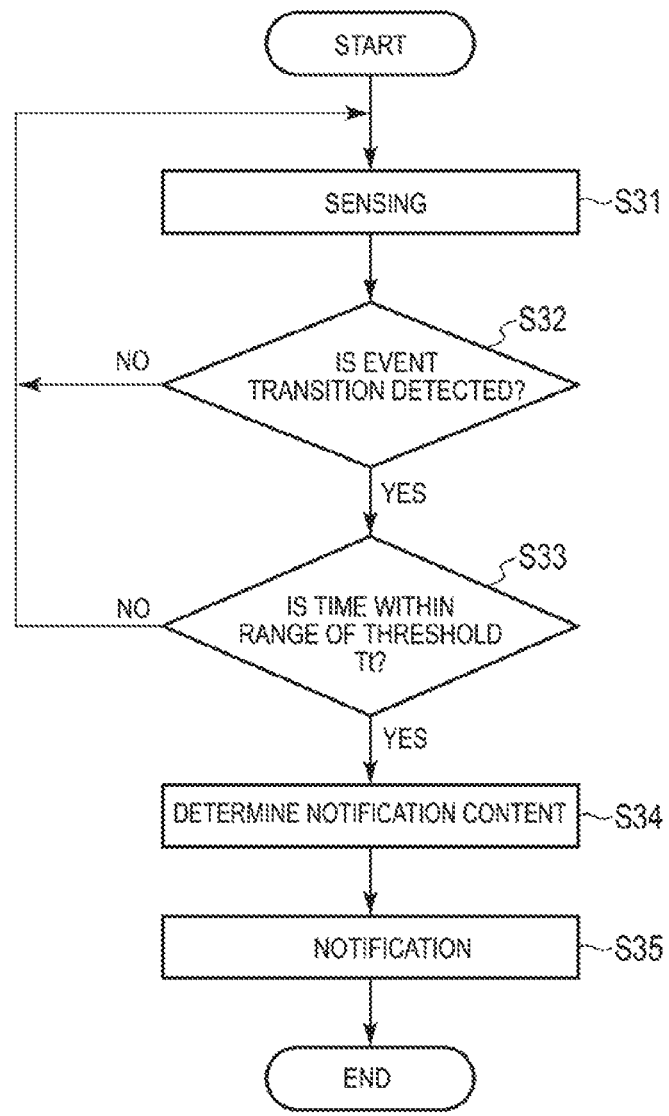
FIG. 12 is a flowchart illustrating an example of operations of the information presentation system according to the third embodiment of the present invention.

FIG. 12 is a flowchart illustrating an example of operations of the information presentation system according to the third embodiment of the present invention.

First, each of the sensor nodes 2 attached to the refrigerator door, the dining chair, and the lid of the trash can as the article 1 and equipped with the acceleration sensor constantly measures acceleration (S31). In a case where there is no change in the measured acceleration, each sensor node 2 constantly broadcasts a false signal by Bluetooth. In a case where there is a change in the acceleration, each sensor node 2 constantly broadcasts a true signal by Bluetooth.

At this time, in order to reduce power consumption, each sensor node 2 may be set so as to communicate with the electronic terminal 3 only when the acceleration changes.

When each article 1 to which the sensor node 2 is attached is moved by the user, the electronic terminal 3 receives a true signal from each sensor node 2, and the information processing unit 33 in the electronic terminal 3 detects an event of use of each article 1 by the user. At this time, the information processing unit 33 refers to the data storage unit 32 and determines whether an event transition registered in the data storage unit 32 has occurred (S32).

FIG. 13 is a diagram illustrating, in a tabular format, relationships of event transitions, time slots, contexts, and notification categories stored in a data storage unit of an electronic terminal of the information presentation system according to the third embodiment of the present invention.

As shown in FIG. 13, the data storage unit 32 stores the event transition, the threshold Tt of the time slot, contexts to which the event transition corresponds, and notification categories corresponding to the contexts.

In the third embodiment, for example, in a case where the event transition in the chronological order of a refrigerator, a dining chair, and a trash can is registered in the data storage unit 32, the processing proceeds to the next step when the event transition is detected.

FIG. 14 is a diagram illustrating, in tabular form, an example of the notification content stored in the data storage unit of the electronic terminal of the information presentation system according to the third embodiment of the present invention.

The information processing unit 33 determines whether the time at which the event transition is detected is time within the range of the threshold Tt stored in the data storage unit 32, for example, time within a range of the time slot after breakfast (S33).

When the time of the detection is within the range of the threshold Tt (Yes in S33), the information processing unit 33 acquires information corresponding to the notification category from the server 4, which is here, information about garbage collection in accordance with the day of the week at the time of detection (see FIG. 14). Then, with reference to the data storage unit 32, the information processing unit 33 determines the notification content associated with the user's action and corresponding to the day of the week (S34), and notifies of the notification content by the information presentation unit 34 (S35).

Note that the transition of events representing the context of after meal is considered to vary depending on the lifestyle. Thus, the information processing unit 33 may learn the rule of the event transitions corresponding to a family in accordance with a record of the event transitions and the like.

In the third embodiment, an example has been illustrated in which the event transition using the refrigerator, the dining chair, and the trash can and the notification content of the context of "clean up after breakfast" and the information about garbage collection are associated with each other.

However, other event transitions, contexts, and notification content can be combined in various ways.

For example, when events occur in the order of a refrigerator, a dining chair, and a sofa as in the row of ID "2" at night (5 PM to 11 PM) in the table shown in FIG. 13, the information processing unit 33 may be designed to detect this occurrence of events may be detected as a context of "relax after dinner" and present recommendation of content such as an electronic book, a television show, or music to the user.

The content of the recommendation used here may be designed to be updated by learning the user's preference from the user's selections.

As another example, when an event transition occurs in the order of a refrigerator, a dining chair, and toothpaste in a time slot in the morning as in the row of ID "3" in the table shown in FIG. 13, the information processing unit 33 may detect this occurrence as a context of "teeth brushing after breakfast" and notify the user of morning news.

Also, as in the row of ID "4" in the table shown in FIG. 13, when a similar event transition occurs at night, the information processing unit 33 may detect this occurrence as a context of "teeth brushing after dinner" and notify the user of news at night.

Further, when a user's voice input function is installed in the electronic terminal 3, and events occur in the order of a refrigerator, a dining chair, and a cosmetic bag in a time slot in the morning as in the row of ID "5" in the table shown in FIG. 13, the information processing unit 33 may detect this occurrence as a context of "makeup after breakfast" and issue a notification of "Is there anything to buy?" to the user, to which the user responds with a shopping list to the system orally while putting on makeup, for example.

Further, the information processing unit 33 may interface with a global positioning system (GPS) of the electronic terminal 3, and the information processing unit 33 may notify the user by displaying, by the information presentation unit 34, a shopping list created from the user's response in the morning when the user approaches the nearest supermarket on the way home, for example.

The information processing unit 33 may detect various event transitions as described above in combination with different events. For example, in the above example, the context of "clean up after breakfast" is associated with the use of a refrigerator, a dining chair, and a trash can. However, instead of a trash can, a water faucet, a door of a dishwasher, or the like may be used as the article 1.

Note that event transitions representing various contexts may vary depending on the life pattern. Thus, the information processing unit 33 may learn a rule of the event transitions corresponding to a family in accordance with the record of event transitions, or may provide a rule as in the third embodiment as a preset, and learn from this rule.

The user may also allow the user to change the rule on the GUI.

Fourth Embodiment

In a fourth embodiment, one embodiment of the present invention is shown that optimizes the notification timing by setting a delay as standby time until the notification to reduce the user's annoyance at the notification.

An overall configuration of the information presentation system according to the fourth embodiment is similar to that of the second embodiment (FIG. 7). The information presentation system according to the fourth embodiment includes the article 1, the sensor node 2, the electronic terminal 3, and the server 4, similarly to the second embodiment. However, the article 1 is a window sash.

In the fourth embodiment, consideration is given for a system that notifies the chance of rain of the day and the need to prepare for rain when the user opens a window in the morning. In this system, for example, the sensor node 2, which is attached to the window sash, detects use of the window by the user. A threshold of a time slot and a threshold of the number of occurrences of events are set as in the second embodiment in an attempt to issue a notification at optimum timing. However, when the notification is issued immediately after the detection of the event, there is a possibility that the user may not hear a sound of the notification because of a sound of a rain shutter opened by the user or the user may be too busy to hear the sound of the notification because the user is tying a curtain.

In such circumstances, it is considered suitable to notify the user a little while after the detection of the event. Thus, in the fourth embodiment, a delay Td in consideration of the psychological burden is provided between the detection of the event and the notification as a condition for reducing the psychological burden on the user for the presentation of information associated with the action, and thus the timing of the notification can be optimized.

That is, in the fourth embodiment, when the timing of the action indicated by the sensor data is a timing within a range of a predetermined time slot, and the number of times of acquisition of sensor data indicating the same action within this range satisfies a condition based on the user's psychological burden, the information to be presented to the user is determined in accordance with the sensor data after a predetermined period of time elapses.

In the fourth embodiment, the article 1 is a window sash, the sensor unit 21 of the sensor node 2 is an acceleration sensor, and the electronic terminal 3 is a smartphone in order to detect use of the window by the user in the morning.

Further, in the fourth embodiment, the threshold Tt of the time slot is from 7 AM to 10 AM, the threshold Tc that is the number of occurrences n of the event in the time slot on the day is one, the delay Td is 30 seconds, and the threshold Tt and the threshold Tc are stored in the data storage unit 32.

Figure 15:
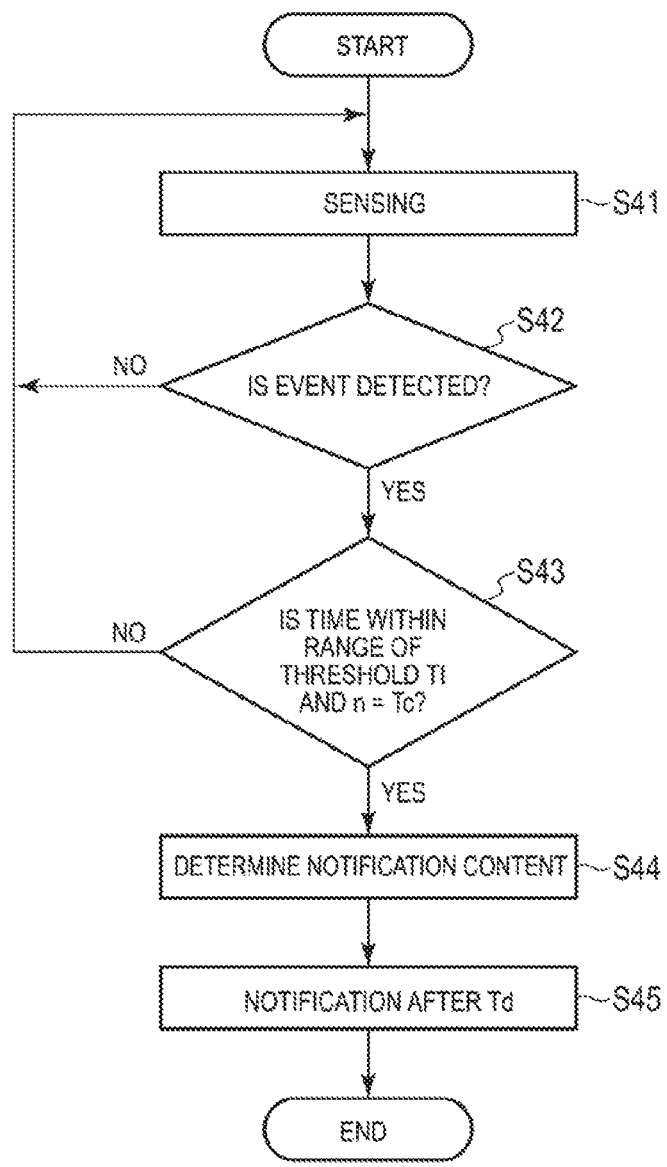
FIG. 15 is a flowchart illustrating an example of operations of an information presentation system according to a fourth embodiment of the present invention.

FIG. 15 is a flowchart illustrating an example of operations of the information presentation system according to the fourth embodiment of the present invention.

First, the sensor node 2, which is attached to the window sash as the article 1 and equipped with the acceleration sensor. is constantly measuring acceleration (S41). In a case where there is no change in the measured acceleration, the sensor node 2 is constantly broadcasting a false signal by Bluetooth. In a case where there is a change in the acceleration, the sensor node 2 is constantly broadcasting a true signal by Bluetooth.

At this time, in order to reduce power consumption, the sensor node 2 may be set so as to communicate with the electronic terminal 3 only when there is a change in the acceleration.

Next, when the window to which the sensor node 2 is attached is opened or closed by the user, the electronic terminal 3 receives a true signal from the sensor node 2, and the information processing unit 33 detects an event of use of the window (S42).

The information processing unit 33 determines whether the time of this detection is time within the range of the threshold Tt stored in the data storage unit 32, and whether the number of occurrences n of the event within the range of the threshold Tt of the time slot is equal to the threshold Tc stored in the data storage unit 32 (S43).

When the time of the detection is within the range of the threshold Tt, and n=Tc (Yes in S43), the information processing unit 33 acquires information about the chance of rain from the server 4, refers to the data storage unit 32, and determines the notification content in accordance with the chance of rain of the current time slot associated with the user's action (S44). Then, after the delay Td stored in the data storage unit 32 elapses, the information processing unit 33 notifies of the notification content by the information presentation unit 34 (S45).

FIG. 16 is a diagram illustrating, in tabular form an example of the notification content stored in the data storage unit 32 of the electronic terminal 3 of the information presentation system according to the fourth embodiment of the present invention.

As shown in FIG. 16, in the data storage unit 32 according to the fourth embodiment, notification content corresponding to a chance of rain between 7 PM and 8 PM is stored as an example. Note that varied notification content may be prepared depending on the day of the week. For example, on weekends and holidays, notification content corresponding to a chance of rain throughout the day may be stored.

Further, the notification content may include softening remarks such as "It's cold this morning." or "It's gotten fairly warm." using data of outside air temperature at the time of the detection of an event and the like. When such real-time sensor data is used, the information processing unit 33 may acquire the data using a nearby sensor device provided with a communication function, rather than acquiring data via the server 4.

In the fourth embodiment, an example has been illustrated in which the event of opening and closing the window and the notification content related to the chance of rain are associated with each other. However, other events and notification content can be combined in various ways.

For example, assuming that the article 1 is a pillow, a notification of "Shall I turn off the light?" may be issued to the user after the user settles into the bed for a while. Assuming that the article 1 is a refrigerator, a dining chair, or a sofa, an event transition of "relax after dinner" may be detected, and a notification of "Latest information on magazines has come." may be issued after the user sits on the soft and settles for a while.

Fifth Embodiment

In the first to fourth embodiments, the psychological burden for the frequency, timing, and content of notifications is determined on the basis of the predefined threshold, and the notification category associated beforehand is presented to the user, thereby reducing the user's annoyance due to proactive notifications.

In contrast, in the fifth embodiment, the psychological burden function can be embodied by setting a model related to the psychological burden for the frequency, timing, and content of notifications. That is, in the fifth embodiment, the information to be presented to the user in accordance with the sensor data is determined when the action indicated by the sensor data is an action that satisfies the condition indicated by the psychological burden function for presenting information to the user.

Figure 17:
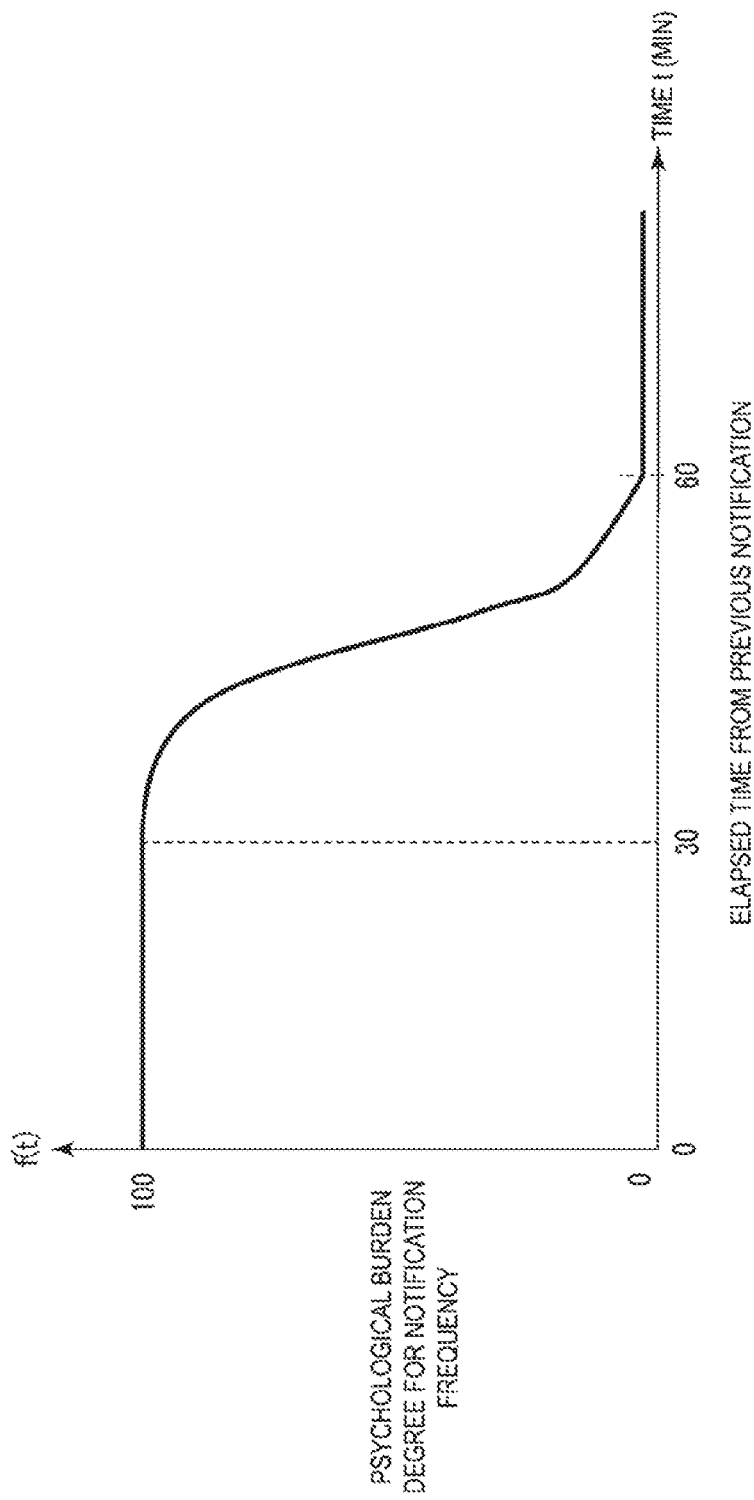
FIG. 17 is a diagram illustrating an example of relationships between elapsed time since a previous notification and a psychological burden degree for a notification frequency used by an information presentation system according to a fifth embodiment of the present invention.

FIG. 17 is a diagram illustrating an example of relationships between elapsed time since a previous notification and the psychological burden degree for a frequency of notifications used by an information presentation system according to the fifth embodiment of the present invention. Frequent notifications having the same nature to the user is highly likely to annoy the user. In the fifth embodiment, as shown in FIG. 17, as conditions for reducing the user's psychological burden for the presentation of information associated with the action, a threshold for a function f (t) (psychological burden function) representing a psychological burden degree for the notification frequency is set and stored in the data storage unit 32.

The minimum value of f (t) is 0, the maximum value of f (t) is 100, and t represents the elapsed time since the previous notification having the same nature. According to this model, for example consideration can be given to processing where, in the electronic terminal 3, when the elapsed time since the previous notification is equal to or less than 50, which is the threshold of f (t), the information processing unit 33 determines that the user's psychological burden is low, determines information to be presented to the user, and issues a notification to the user by the information presentation unit 34.

A notification associated with a function such as f (t) is considered to be, for example, a notification of a question about the mental health issued to the user, as shown in the first embodiment. In the fifth embodiment, the model was set using the function f (t) as a function representing the psychological burden degree for the notification frequency. However, it is considered that various function forms may be suitable, such as exponential function, logarithmic function, or quadratic function, depending on the content of the notification.

FIG. 18 and FIG. 19 are diagrams each illustrating an example of a semantic space model used by the information presentation system according to the fifth embodiment of the present invention.

A distance in the semantic space model is considered to be used as a model of the psychological burden for the timing and content. The user's psychological burden is increased when the information of the content irrelevant to the user's action is presented.

Thus, for example, when the user is cooking, the information related to cooking is preferably determined as information to be presented to the user. When the user is spending time together with his or her family, information suitable to togetherness is preferably determined as information to be presented to the user. Then, the determined information is preferably presented to the user.

Thus, in the fifth embodiment, as shown in FIG. 18 and FIG. 19, metadata of the context is given in advance to a combination of the article, use of a location (event), and a time slot to which the time of occurrence of an event or event transition belongs (see FIG. 18), metadata is given in advance to the notification category (see FIG. 19), and this data is stored in the data storage unit 32.

Then, when an event or event transition occurs, the information processing unit 33 of the electronic terminal 3 reads metadata, which is closest in the semantic space model to metadata of the notification category, from the data storage unit 32, as information to be presented to the user. The information presentation unit 34 notifies the user of this metadata, thereby reducing the user's psychological burden for the timing and content of the notification.

Further, the information processing unit 33 may combine the multiple types of semantic space models to obtain the frequency, timing, and content of notifications imposing a low psychological burden, or may add items such as urgency or importance of the notification to the semantic space model.

Sixth Embodiment

In the first to fifth embodiments, the frequency, timing, and content of notifications are optimized by predefined parameters to reduce the user's annoyance due to proactive notifications.

In contrast, the sixth embodiment illustrates one embodiment of the present invention in which a function is provided that feedback is given from the user to the system about whether the frequency, timing, and content according to the predefined parameters have been appropriate for the user, and thus a notification is issued in a manner suitable to the user's living environment, thereby reducing the user's annoyance for the notification.

The feedback for the threshold $T_i$ of the interval of the notification related to the optimization of the notification frequency and the notification timing may be, for example, "This notification timing is not annoying.", "This notification timing is annoying.", "Decrease the notification frequency.", or "Increase the notification frequency." on the GUI provided in the electronic terminal 3 when the notification content is displayed on the electronic terminal 3. Further, the user may select the feedback, and the information processing unit 33 may update the interval threshold $T_i$ stored in the data storage unit 32 in accordance with the feedback.

Regarding the feedback for the threshold $T_t$ for performing control in accordance with a time slot in which an event or event transition has been detected, for example, the user may select feedback such as "This notification content is good." or "This notification content is not so good." on the GUI provided in the electronic terminal 3 when the notification content is displayed on the electronic terminal 3, and the information processing unit 33 may utilize the feedback for learning the threshold $T_t$.

Further, when the notification content is displayed on the electronic terminal 3 on the GUI included in the electronic terminal 3, an item of "Change the notification category at the this timing." and "Change the notification timing for this notification category." may be prepared and selected by the user.

Regarding the feedback for the delay $T_d$ from after detection of the event or event transition until the notification, when the notification content is displayed on the electronic terminal 3, items such as "Delay the notification for x seconds." and "Advance the notification by x seconds." (a number is selected from a pull-down menu or the like for x) may be prepared on the GUI included in the electronic terminal 3 and selected by the user.

Figure 20:
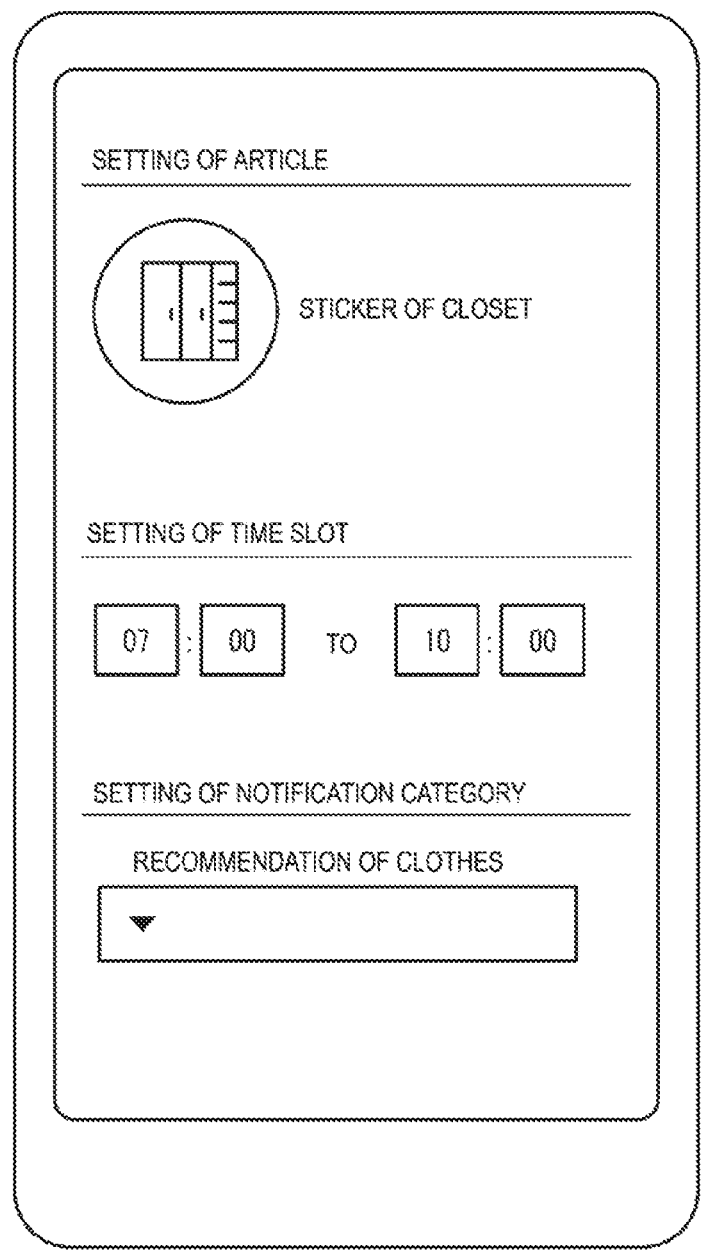
FIG. 20 is a diagram illustrating an example of a feedback selection screen used by an information presentation system according to a sixth embodiment of the present invention.
Figure 21:
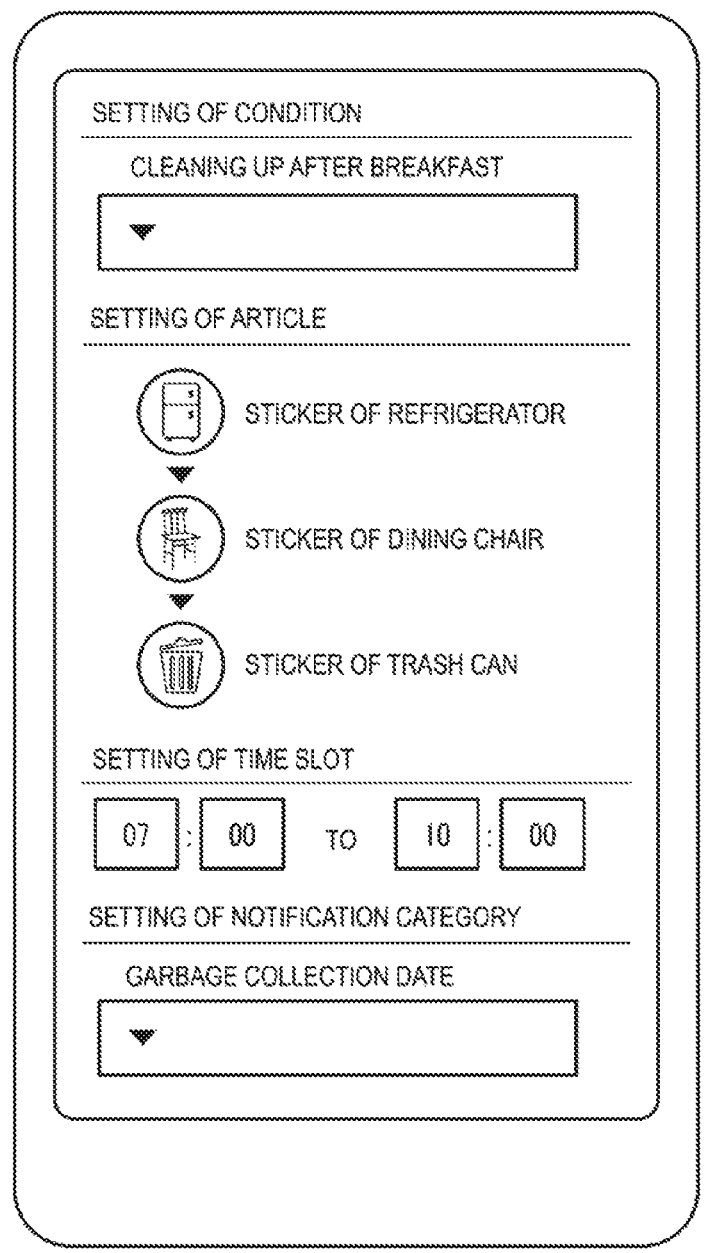
FIG. 21 is a diagram illustrating an example of the feedback selection screen used by the information presentation system according to the sixth embodiment of the present invention.

FIG. 20 and FIG. 21 are diagrams each illustrating an example of a feedback selection screen used by the information presentation system according to the sixth embodiment of the present invention.

Other than the feedback that reduces the uses annoyance due to proactive notifications, for example, on a setting screen of an application related to one embodiment of the present invention on the electronic terminal 3, a screen may be prepared on a GUI as shown in FIG. 20 such that the event or event transition that triggers a notification, the threshold $T_t$ for performing control in accordance with the time slot, and the notification category are linked to one another.

However, in FIG. 20 and FIG. 21, an expression of "sticker" is used for the sensor node 2. At this time, the notification category may be selected by the user from a list prepared in advance, and may be found in a natural sentence.

Alternatively, a similar notification category may be displayed on the electronic terminal 3 through search by a natural sentence.

Further, as shown in FIG. 21, a setting of situation may be selected. When a situation is selected here, an event or event transition that describes the situation and a time slot of the corresponding notification and preset notification content may be displayed, and the user may adjust the preset content to appropriate notification content.

A list of setting of situation may include, as options, situations such as "time for opening a rain shutter in the morning", "during clean up after breakfast", "during teeth brushing after breakfast," "during makeup in the morning," "relaxing time after dinner", "after going to bed", and "time for laundry".

Further, for example, a family structure, time family members spend at home, time slots in which the family members are outdoor, and the like can be set on the setting screen of the application. Then, the information processing unit 33 may optimize the initial values of various parameters for the environment.

In the above embodiments, the sensor node 2 and the electronic terminal 3 are configured to be able to communicate directly by Bluetooth or the like, but may be configured to be able to communicate via a gateway or the like. At this time, the electronic terminal 3 may have a function such as the event detection, or a gateway may have the function. Alternatively, the sensor node 2 may be equipped with the information presentation unit such as a speaker or a display, this information presentation unit may be able to directly communicate with the server 4. Furthermore, the information presentation unit 34 may be provided outside of the electronic terminal 3.

Further, only the sensor node in accordance with the scenario of the embodiments is included in the configuration in the above embodiments in order to facilitate understanding. However, the electronic terminals may constantly receive events from multiple sensor nodes irrelevant to the scenario.

The present invention is not limited to the embodiments described above, but various changes and modifications can be made without departing from the gist of the present invention. Furthermore, the embodiments may be implemented in combination appropriately as long as it is possible, and in this case, combined effects can be obtained. Further, the above embodiments include inventions on various stages, and various inventions may be extracted by appropriate combinations of the disclosed multiple configuration requirements.

The techniques described in the embodiments include, as a program (software means) that can be executed by a processor of a computing machine (computer), a recording medium such as a magnetic disk (floppy (registered trademark) disk, hard disk, or the like), an optical disk (CD-ROM, DVD, MO, or the like), or a semiconductor memory (ROM, RAM, flash memory, or the like), and transmitted and distributed by a communication medium. Note that the program stored on the medium side includes a setting program for configuring, in a computing device, a software means (including not only an execution program but also a table and a data structure) to be executed by the computing device. The computing device which realizes the present information processing device reads the program recorded in the recording medium, optionally builds the software means by the setting program, and executes the above-described processing by controlling the operation with the software means. Note that the recording medium referred to herein is not limited to a recording medium for distribution, but includes a storage medium such as a magnetic disk or a semiconductor memory provided in a computing machine or a device connected via a network.

REFERENCE SIGNS LIST

1 Article
2 Sensor node
3 Electronic terminal
4 Server
21 Sensor unit
22, 33 Information processing unit
23, 31, 41 Communication unit
32 Data storage unit
34 Information presentation unit
42 Weather information storage unit

The invention claimed is:

1. An information processing device comprising:
a receiver configured to receive sensor data related to a user's action;
a storage configured to store a condition indicated by a threshold based on a psychological burden for information that is associated with the user's action and is to be presented to the user and for presentation of the information associated with the action related to the user or a threshold indicated by a psychological burden function; and
a determination unit, implemented using one or more computing devices, configured to determine a content and a presentation timing of the information that is associated with the action indicated by the sensor data and is to be presented to the user from information stored in the storage based on the action indicated by the sensor data received by the receiver satisfying the condition related to the user and stored in the storage,
wherein the storage is configured to store a condition indicated by a threshold of a time slot to which the timing of the action indicated by the sensor data received by the receiver belongs and a condition indicated by a threshold of a number of times of acquisition of sensor data indicating an identical action, and
wherein the determination unit is further configured to determine the information that is associated with the action indicated by the sensor data and is to be presented to the user from the information stored in the storage based on the timing of the action indicated by the sensor data received by the receiver being within a range of a predetermined time slot and the number of times of acquisition of the sensor data indicated by the identical action within the range satisfying the condition stored in the storage.

2. The information processing device according to claim 1,
wherein the storage is configured to store a condition indicated by a threshold of an interval between a timing of an action indicated by a latest data of the sensor data received by the receiver and a timing of an action indicated by a previous data of the sensor data received by the receiver, and
wherein the determination unit is further configured to determine the information to be presented to the user and corresponding to the action indicated by the latest data from the information stored in the storage based on the interval between the timing of the action indicated by the latest data of the sensor data received by the receiver and the timing of the action indicated by the previous data of the sensor data received by the receiver satisfying the condition stored in the storage.

3. The information processing device according to claim 1, further comprising a second determination unit, implemented using one or more computing devices, configured to determine whether the action indicated by the sensor data received by the receiver indicates a transition of actions,
wherein the storage is configured to store a condition indicated by a threshold of a time slot to which a timing at which the transition of actions is determined belongs, and
wherein the determination unit is configured to determine the information that is associated with the action indicated by the sensor data and is to be presented to the user from the information stored in the storage based on the second determination unit determining that the action indicated by the sensor data indicates the transition of actions and the timing at which the transition of actions is determined being within a range of the time slot indicated by the threshold stored in the storage.

4. The information processing device according to claim 1,
wherein the determination unit is configured to determine the information that is associated with the action indicated by the sensor data and is to be presented to the user from the information stored in the storage after a predetermined period of time based on the psychological burden elapsing when the timing of the action indicated by the sensor data received by the receiver is within the range of the predetermined time slot and the number of times of acquisition of the sensor data indicated by the identical action within the range satisfies the condition stored in the storage.

5. The information processing device according to claim 1, further comprising:
a presentation unit, implemented using one or more computing devices, configured to present the information determined by the determination unit to the user;
an input unit, implemented using one or more computing devices, configured to accept an input of feedback from the user about presentation of the information by the presentation unit; and
an update unit, implemented using one or more computing devices, configured to update the threshold stored in the storage in accordance with the feedback input by the input unit.

6. An information processing method performed by an information processing device, the method comprising:
receiving sensor data related to a user's action;
determining a content and a presentation timing of information that is associated with the action indicated by the sensor data and is to be presented to the user from a storage configured to store information that is in accordance with the user's action and is to be presented to the user based on the action indicated by the received sensor data satisfying a condition indicated by (i) a threshold based on a psychological burden for presentation of the information associated with the action related to the user or (ii) a threshold indicated by a psychological burden function;
storing, in the storage, a condition indicated by a threshold of a time slot to which the timing of the action indicated by the received sensor data belongs and a condition indicated by a threshold of a number of times of acquisition of sensor data indicating an identical action; and determining the information that is associated with the action indicated by the sensor data and is to be presented to the user from the stored information based on the timing of the action indicated by the received sensor data being within a range of a predetermined time slot and the number of times of acquisition of the sensor data indicated by the identical action within the range satisfying the stored condition.

7. A non-transitory computer recording medium storing an information processing program, wherein execution of the information processing program causes one or more computers to perform operations comprising:

receiving sensor data related to a user's action;

storing a condition indicated by a threshold based on a psychological burden for information that is associated with the user's action and is to be presented to the user and for presentation of the information associated with the action related to the user or a threshold indicated by a psychological burden function;

determining a content and a presentation timing of the information that is associated with the action indicated by the sensor data and is to be presented to the user from the stored information based on the action indicated by the received sensor data satisfying the stored condition;

storing a condition indicated by a threshold of a time slot to which the timing of the action indicated by the received sensor data belongs and a condition indicated by a threshold of a number of times of acquisition of sensor data indicating an identical action; and determining the information that is associated with the action indicated by the sensor data and is to be presented to the user from the stored information based on the timing of the action indicated by the received sensor data being within a range of a predetermined time slot and the number of times of acquisition of the sensor data indicated by the identical action within the range satisfying the stored condition.

8. The non-transitory computer recording medium according to claim 7, wherein the operations further comprise:

storing a condition indicated by a threshold of an interval between a timing of an action indicated by a latest data of the received sensor data and a timing of an action indicated by a previous data of the sensor data, and determining the information to be presented to the user and corresponding to the action indicated by the latest data from the stored information based on the interval between the timing of the action indicated by the latest data of the received sensor data and the timing of the action indicated by the previous data of the sensor data satisfying the stored condition.

9. The non-transitory computer recording medium according to claim 7, wherein the operations further comprise:

determining whether the action indicated by the received sensor data indicates a transition of actions;

storing a condition indicated by a threshold of a time slot to which a timing at which the transition of actions is determined belongs; and determining the information that is associated with the action indicated by the sensor data and is to be presented to the user from the stored information based on the determination that the action indicated by the sensor data indicates the transition of actions and the timing at which the transition of actions is determined being within a range of the time slot indicated by the stored threshold.

10. The non-transitory computer recording medium to claim 7 wherein the operations further comprise:

determining the information that is associated with the action indicated by the sensor data and is to be presented to the user from the stored information after a predetermined period of time based on the psychological burden elapsing when the timing of the action indicated by the received sensor data is within the range of the predetermined time slot and the number of times of acquisition of the sensor data indicated by the identical action within the range satisfies the stored condition.

11. The non-transitory computer recording medium according to claim 7, wherein the operations further comprise:

presenting the determined information to the user;

accepting an input of feedback from the user about presentation of the information; and updating the stored threshold in accordance with the feedback input.

12. The information processing method according to claim 6, further comprising:

storing a condition indicated by a threshold of an interval between a timing of an action indicated by a latest data of the received sensor data and a timing of an action indicated by a previous data of the sensor data; and determining the information to be presented to the user and corresponding to the action indicated by the latest data from the stored information based on the interval between the timing of the action indicated by the latest data of the received sensor data and the timing of the action indicated by the previous data of the sensor data satisfying the stored condition.

13. The information processing method according to claim 6, further comprising:

determining whether the action indicated by the received sensor data indicates a transition of actions;

storing a condition indicated by a threshold of a time slot to which a timing at which the transition of actions is determined belongs; and determining the information that is associated with the action indicated by the sensor data and is to be presented to the user from the stored information based on the determination that the action indicated by the sensor data indicates the transition of actions and the timing at which the transition of actions is determined being within a range of the time slot indicated by the stored threshold.

14. The information processing method according to claim 6, further comprising:

determining the information that is associated with the action indicated by the sensor data and is to be presented to the user from the stored information after a predetermined period of time based on the psychological burden elapsing when the timing of the action indicated by the received sensor data is within the range of the predetermined time slot and the number of times of acquisition of the sensor data indicated by the identical action within the range satisfies the stored condition.

15. The information processing method according to claim 6, further comprising:
  presenting the determined information to the user;
  accepting an input of feedback from the user about presentation of the information; and
  updating the stored threshold in accordance with the feedback input.

\* \* \* \* \*